US006444326B1

(12) United States Patent
Smith

(10) Patent No.: US 6,444,326 B1
(45) Date of Patent: Sep. 3, 2002

(54) SURFACE MODIFICATION OF SOLID SUPPORTS THROUGH THE THERMAL DECOMPOSITION AND FUNCTIONALIZATION OF SILANES

(75) Inventor: David Abbott Smith, State College, PA (US)

(73) Assignee: Restek Corporation, Bellefonte, PA (US)

( * ) Notice: Subject to any disclaimer, the term of this patent is extended or adjusted under 35 U.S.C. 154(b) by 0 days.

(21) Appl. No.: 09/388,868

(22) Filed: Sep. 2, 1999

Related U.S. Application Data

(60) Provisional application No. 60/122,990, filed on Mar. 5, 1999.

(51) Int. Cl.[7] .............................. B32B 9/04; C23C 16/24
(52) U.S. Cl. ....................... 428/448; 428/446; 428/447; 428/450; 428/428; 428/429; 427/255.11; 427/255.15; 427/255.18; 427/255.26; 427/255.27; 427/255.7; 427/387; 427/541
(58) Field of Search ................................. 428/446, 447, 428/448, 450, 428, 429; 427/541, 387, 255.11, 255.15, 255.18, 255.26, 255.27, 255.7

(56) References Cited

U.S. PATENT DOCUMENTS

| 4,473,597 A | * | 9/1984 | Pankove et al. ............... 427/39 |
| 4,741,964 A | * | 5/1988 | Haller ........................ 428/446 |
| 5,017,540 A | * | 5/1991 | Sandoval et al. ........... 502/158 |
| 5,326,738 A | * | 7/1994 | Sandoval et al. ........... 502/401 |
| 5,505,989 A | * | 4/1996 | Jenkinson ................... 427/166 |
| 5,723,034 A | * | 3/1998 | Ohmi .................... 204/192.23 |

FOREIGN PATENT DOCUMENTS

JP        01229265 A   *   9/1989

* cited by examiner

Primary Examiner—Robert Dawson
Assistant Examiner—Jeffrey B. Robertson
(74) Attorney, Agent, or Firm—John F.A. Earley; John F.A. Earley III; Harding, Earley, Follmer, & Frailey

(57) ABSTRACT

Method of modifying the surface properties of a substrate by depositing a coating of hydrogenated amorphous silicon on the surface of the substrate and functionalizing the coated substrate by exposing the substrate to a binding reagent having at least one unsaturated hydrocarbon group under pressure and elevated temperature for an effective length of time. The hydrogenated amorphous silicon coating is deposited by exposing the substrate to silicon hydride gas under pressure and elevated temperature for an effective length of time.

26 Claims, 1 Drawing Sheet

SURFACE MODIFICATION OF SOLID SUPPORTS THROUGH THE THERMAL DECOMPOSITION AND FUNCTIONALIZATION OF SILANES

RELATED APPLICATIONS

This application claims priority to Provisional Application No. 60/122,990 entitled Surface Functionalization of Solid Supports Through the Thermal Decomposition and Hydrosilylation of Silanes filed Mar. 5, 1999 by David Abbott Smith.

FIELD OF THE INVENTION

This invention relates to a process for depositing a layer of hydrogenated amorphous silicon (a-SiH) to a substrate, followed by a reaction of an unsaturated reagent to modify the surface properties including, but not limited to, inactivity to acidic, basic, and neutral compounds, resistivity to attack from caustic environments, and wettability toward other compounds. Radical quenching processes may also be used to complete the surface modification.

BACKGROUND OF PRIOR ART

The current invention has been developed to overcome the inherent undesirable molecular activities of metal (ferrous and non-ferrous), glass, and ceramic surfaces which can cause the following: (a) chemisorption of other molecules, (b) reversible and irreversible physisorption of other molecules, (c) catalytic reactivity with other molecules, (d) allow attack from foreign species, resulting in a molecular breakdown of the surface, or (e) any combination of (a)–(d). The prior art shows the use of silanes or silicon hydrides to modify surfaces. The present invention utilizes the formation of a hydrogenated amorphous silicon coating on a surface through the decomposition of silanes or silicon hydrides, followed by a secondary process of surface functionalization with a reagent containing at least one unsaturated hydrocarbon group (e.g., —CH=$CH_2$ or —C≡CH). Additional elimination of residual surface defects can be achieved through reagents capable of thermal disproportionation and/or radical quenching.

It is known in the prior art to form a silicon hydride surface through a) halogenation of surface silanol moieties followed by reduction, and b) reacting surface silanol moieties with reagents such as trihydroxyhydridosilane via sol-gel type methods. This invention utilizes the thermal decomposition and deposition of silanes or silicon hydrides to impart an hydrogenated amorphous silicon layer on the substrate. The substrate does not require the presence of surface silanol moieties for the deposition to occur, thereby allowing a wide range of substrate types, such as metals, glasses and ceramics.

It is known in the prior art to functionalize a silicon-hydride surface with unsaturated hydrocarbon reagents in the presence of a metal catalyst. The complete removal of this catalyst from the treated system is often difficult and trace presence of the catalyst can reintroduce undesirable surface activity. The present invention does not employ an additional metal catalyst. Instead, the process is driven by heat. Without the use of a metal catalyst, the final product is void of additional residual catalyst activity and does not require removal of it.

It is known in the prior art to enhance the silicon hydride surface concentration by treatment of silicon metaloid with hydrofluoric acid. This invention utilizes the inherent formation of a silicon hydride surface via the thermal decomposition of silanes. Further treatment to enhance silicon hydride surface moieties are not necessary.

SUMMARY OF THE INVENTION

The present invention provides a modifying the surface properties of a substrate by depositing a layer of hydrogenated amorphous silicon on the surface of the substrate and then functionalizing the coated substrate by exposing the substrate to a binding reagent having at least one unsaturated hydrocarbon group. Using the method of the present invention, surface properties such as inactivity to acidic, basic and neutral compounds, resistivity to attack from caustic environments, and wettability toward other compounds is modified. The method can be used on ferrous and non-ferrous metal, glass and ceramic surfaces.

The method of modifying the surface properties of a substrate of the present invention comprises the steps of depositing a coating of hydrogenated amorphous silicon on the surface of the substrate, and then functionalizing the coated substrate by exposing the substrate to a binding reagent having at least one unsaturated hydrocarbon group under elevated temperature for a predetermined length of time. The hydrogenated amorphous silicon coating is deposited by exposing the substrate to silicon hydride gas under elevated temperature for a predetermined length of time. The pressure, temperature and time of exposure to hydrogenated amorphous silicon is controlled to prevent formation of hydrogenated amorphous silicon dust.

The substrate is initially cleaned by heating it at a temperature between about 100° and about 600° C. for a time period ranging from a few minutes to about 15 hours before exposing the substrate to hydrogenated amorphous silicon. In an embodiment, the substrate is cleaned at about 120° C. for about 1 hour.

In a preferred embodiment, the substrate is isolated in an inert atmosphere before exposing the substrate to silicon hydride gas. The substrate is exposed to silicon hydride gas at a pressure between about 0.01 p.s.i.a. to about 200 p.s.i.g. and a temperature between about 200° and 600° C. for about 10 minutes to about 24 hours. More preferably, the substrate is exposed to silicon hydride gas at a pressure between about 1.0 p.s.i.a. and about 100 p.s.i.a. and a temperature between about 300° and 600° C. for about 30 minutes to about 6 hours. Better yet, the substrate is exposed to silicon hydride gas at a temperature between about 350° and about 400° C. for about 4 hours.

The pressure of the silicon hydride gas is preferably between about 2.3 p.s.i.a. and about 95 p.s.i.a.

In an embodiment of the invention, the substrate is exposed to silicon hydride gas at a temperature of about 400° C. and pressure of about 2.5 p.s.i.a. In another embodiment, the substrate is exposed to silicon hydride gas at a temperature of about 40° C. and a pressure of about 44 p.s.i.g., and then the temperature is raised to about 355° C.

The substrate is also preferably isolated in an inert atmosphere before functionalizing the coated substrate with a substitute unsaturated hydrocarbon. The substrate is functionalized at a pressure between about 0.01 p.s.i.a. to about 200 p.s.i.a. and a temperature between about 200° and 500° C. for about 30 minutes to about 24 hours. More preferably, the substrate is exposed to the binding reagent at a temperature less than about 100° C., and then the temperature is increased to between 250° and 500° C. while the pressure is maintained less than about 100 p.s.i.a.

The method may include the step of quenching residual silicon radicals in the hydrogenated amorphous silicon coating either before or after the hydrosilylation step. In this step, the substrate is isolated in an inert atmosphere before quenching the residual silicon radicals in the silicon coating. Preferably, the substrate is quenched exposing the substrate to organosilanes, amines, or known radical scavengers under elevated pressure and temperature for a predetermined length of time to cause thermal disproportionation. The substrate is quenched at a temperature between about 250° and 500° C. for about 30 minutes to about 24 hours.

The method may also include the step of exposing the substrate to oxygen prior to or contemporaneous with the hydrosilylation step. In one embodiment, up to about 5% by weight oxygen is mixed with said binding reagent. In another embodiment, the substrate is exposed to 100% oxygen or mixtures of oxygen in other gases at a temperature of about 100° to 450° C. for a few seconds to about 1 hour prior to hydrosilylating. More preferably, the substrate is exposed to zero air at about 25 p.s.i.g. and about 325° C. for about 1 minute.

DESCRIPTION OF PREFERRED EMBODIMENTS OF THE INVENTION

Figure 1:
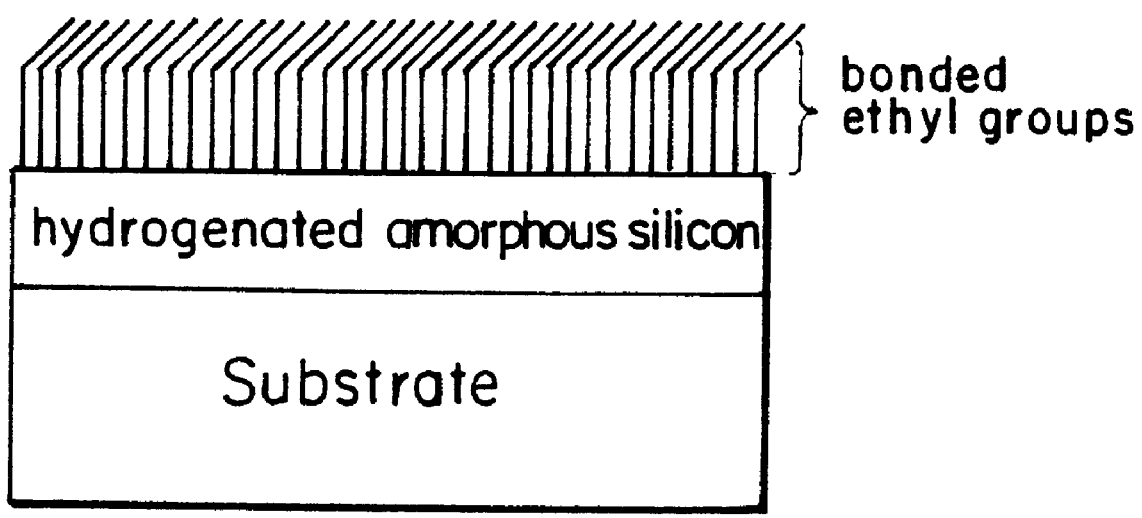
FIG. 1 is a schematic illustration of a substrate treated in accordance with the present invention.

The invention disclosed herein comprises a primary treatment step, followed by further steps of hydrogenated amorphous silicon functionalization. These additional processes include the reaction types of hydrosilylation, disproportionation and radical quenching.

The process of the present invention utilizes elevated temperatures and inert atmospheres. The substrate or surface to be treated must be isolated in a system which permits the flow of gases via pressure and vacuum, and within a heat source, such as an oven. For example, the surface to be treated could be within a steel vessel with tubing connections to allow gas flows. Depending on the cleanliness of the substrate, it may be cleaned initially by heating it under air atmosphere at a temperature between about 100° C. and about 600° C. for a time period ranging from a few minutes to about 15 hours, better yet about 0.5 to about 15 hours. In a preferred embodiment, the substrate is cleaned at about 120° C. for about 1 hour. After this oxidation step, the atmosphere within the vessel is made inert by flushing the vessel with an inert gas and applying a vacuum. The substrate may also be cleaned with an appropriate liquid or supercritical fluid solvent.

After the substrate is cleaned and the vessel is evacuated, the substrate is exposed to silicon hydride gas ($SiH_4$, $Si_nH_{2n+2}$) under elevated pressure and temperature for a predetermined period of time. Silicon hydride gas is introduced into the vessel at a pressure between about 0.01 pounds per square inch absolute (psia) and about 200 pounds per square inch gauge pressure (psig). The silicon gas may be introduced into the vessel at low pressure and an elevated temperature, such as 2.5 p.s.i.a. and 400° C. Alternatively, the silicon gas may be introduced at a moderate pressure and low temperature, such as 44 p.s.i.g. and 40° C., and then ramped to a high temperature such as 355° C. In either case, the substrate should be exposed to silicon hydride gas at an elevated temperature from about 200° to about 600° C., better yet between about 300° and 600° C., and preferably from about 350° to 400° C. for an extended period of time. The exposure time of the substrate to silicon hydride gas may range from 10 minutes to 24 hours, preferably between about 30 minutes and about 6 hours, and typically about 4 hours. A preferred temperature is 350° C.–400° C. for 4 hours.

In the presence of heat, the silicon hydride gas thermally dissociates to form silane radicals which recombine and bind to the substrate surface. The resultant coating is hydrogenated amorphous silicon which has Si—Si, Si—H, and Si• (radical) moieties on the surface and in the bulk.

The time, pressure and temperature of the silicon hydride gas exposure step will vary depending on the chemical properties of the substrate. The time, pressure and temperature must be controlled to avoid undesirable by-products of the exposure step. For example, if the pressure and temperature are too high, or if the substrate is exposed to silicon gas for too long a time period, undesirable hydrogenated amorphous silicon dust may form on the substrate. Minimization of dust formation is unique to the vessel type, substrate type and substrate surface area. If the pressure or temperature is too low, or if the exposure step is too short, no silicon coating will form, or an inhomogeneous coating of hydrogenated amorphous silicon will form. Optimization of the silane deposition process (dust minimization and uniform film deposition) is achieved through pressure, temperature and time variations for each unique process.

After the hydrogenated amorphous silicon deposition process is complete, the system is purged with an inert gas to remove silane moieties not bound to the substrate surface. After the inert gas purge, the vessel is evacuated. A binding agent is then introduced into the vessel under elevated temperature and pressure. With heat as a driving force, the reagent reacts with and binds to the hydrogenated amorphous silicon surface via silicon hydride moieties.

The reagent used determines the physical properties displayed by the newly functionalized surface. Surface properties of the substrate can be tailored for a wide variety of functions depending on the reagent used in the process. The binding reagent must have at least one unsaturated hydrocarbon group (i.e., —CH═$CH_2$ or —C≡CH). The reagent may be further comprised of hydrocarbons, substituted hydrocarbons, carbonyls, carboxyls, esters, amines, amides, sulfonic acids, and epoxides.

A preferred binding reagent is ethylene. The binding agent is introduced into the vessel at a pressure range of about 0.01 to about 200 p.s.i.a. The binding agent is preferably introduced into the vessel at a temperature less than about 100° C. For example, in one embodiment, the binding agent is introduced into the vessel at less than about 100° C. and about 25 p.s.i.g.

After the binding agent is introduced into the vessel, the temperature of the reagent is raised to about 200° to about 500° C., better yet up to about 250° to about 500° C. Preferably, the increased reaction pressure is less than about 200 p.s.i.a., better yet less than about 100 p.s.i.a. For example, in one embodiment, the reaction temperature is about 360° C. The reaction time varies from 30 minutes to 24 hours, but typically lasts about 4 hours.

The presence of oxygen mixed at low levels (0–5%) with ethylene, or an oxygenation step (100% oxygen or mixtures of oxygen in other gases) prior to hydrosilylating the substrate, has also shown to assist the deactivation qualities of the hydrogenated amorphous silicon surface. If the process employs an oxygen/ethylene gas mixture, a typical ratio is 2.5% zero air (a nitrogen/oxygen mix) in ethylene. If an oxygenation step is used prior to hydrosilylation (ethylene bonding), the process includes flushing the surface with oxygen/oxygen-containing mixtures at high temperatures, about 100 to about 450° C., for a period of time ranging from a few seconds to about 1 hour. A typical preoxygenation step involves flushing the surface with zero air at about 25 p.s.i.g. for about 1 minute at 325° C.

Surface defects in the hydrogenated amorphous silicon surface, also known as "dangling bonds" or silicon radicals, may create undesirable secondary reactions between the surface and other compounds if left untreated. Quenching of residual radicals is achieved by thermal disproportionation of organosilanes ($SiR_1R_2R_3R_4$, amines (e.g., $NR_1R_2R_3$) or known radical scavengers (e.g., BHT, hydroquinone, reducing agents, thiols), where $R_{1-4}$=H, alkyl, alkenyl, aryl, halogen, amine, organosilyl). One example is phenylmethylvinylsilane. This process may be employed prior to or subsequently after reacting the hydrogenated amorphous silicon with a terminally unsaturated hydrocarbon. Ranges of reaction time and temperature are 250° C.–500° C. and 30 minutes to 24 hours.

Examples of applications for this invention are, but not limited to, the passivation and/or modification of solid supports, transfer lines, inlet systems, detector systems, columns, etc. used in chromatographic analyses, and the passivation and enhancement of corrosive resistivity of metal surfaces.

EXAMPLES

The following examples are provided to further illustrate the invention.

Example 1

Borosilicate inlet liners are used in gas chromatography instruments as the area of sample introduction and transfer on to a gas chromatography column. Since raw borosilicate glass has an active surface and is adsorptive to many compounds, it is typically deactivated through a silanization process. Standard silanizations give a relatively inert surface, but do not allow for universal inertness to acidic and basic compounds (e.g., carboxylic acids and amines). Some liners work well for acidic compounds and fewer types work well for basic compounds. The current invention provides a surface which will prevent the adsorption of acidic and basic compounds to the inlet liner surface.

Borosilicate inlet liners are packed into a stainless steel vessel which is sealed and connected to inlet and outlet tubing. The tubing is passed through the ceiling of an oven and connected to two separate manifolds through which gases and vacuum can be applied to the vessel via valve systems. With atmospheric pressure air in the vessel, the vessel temperature is increased to 120° C. and held for 1 hour. At the end of 1 hour, the vessel environment is made inert by a nitrogen purge and applied vacuum. The vessel is heated to 400° C. After evacuation of the vessel, 100% silane gas ($SiH_4$) is introduced at 2.5 psia. The temperature is held at 400° C. for 4 hours during which a hydrogenated amorphous silicon layer is deposited on the borosilicate glass. The temperature is then decreased to 360° C. followed by a nitrogen purge of the remaining unreacted silane gas. The vessel environment is again made inert by nitrogen purge and applied vacuum. After evacuation of the vessel at 360° C., ethylene gas is introduced at 25 psig and 360° C. is held for 4 hours. Ethylene then bonds via the Si—H surface moieties to form an Si-ethyl surface. Unreacted ethylene is then purged out with nitrogen and the vessel environment is made inert by nitrogen purge and applied vacuum. If radical quenching is necessary, phenylmethylvinylsilane vapor is introduced at 360° C. and 16 psia, and that temperature is held for 4 hours. Unreacted phenylmethylvinylsilane is then purged out with nitrogen as the oven is cooled down to room temperature.

Example 2

Uncoated fused silica capillary columns are used in gas chromatography instruments as an inert transfer line from the inlet liner to the coated fused silica capillary analytical column. Since raw fused silica glass has an active surface and is adsorptive to many compounds, it is typically deactivated through a silanization process. Standard silanizations give a relatively inert surface, but do not allow for universal inertness to acidic and base compounds (e.g., carboxylic acids and amines). Some deactivated fused silica columns work well for acidic compounds and fewer types work well for basic compounds. Also, typical deactivations are not resistive to repetitive subjection to caustic environments. The current invention provides a surface on a fused silica capillary which will prevent the adsorption of acidic and basic compounds, as well as resist degradation by caustic environments.

Fused silica capillary tubing is coiled and tied in 30 m lengths, and its end are passed through the ceiling of an oven and connected to two separate manifolds through which gases and vacuum can be applied via valve systems. The inherent internal cleanliness of fused silica tubing does not require an oxidative cleaning step. The inside of the tubing is made inert by a nitrogen purge and applied vacuum. After evacuation of the tubing, 100% silane gas ($SiH_4$) is introduced at 60 psig. The temperature is ramped to 350° C. and held for 4 hours during which a hydrogenated amorphous silicon layer is deposited on the inside of the capillary. The temperature is then decreased to 40° C. followed by a nitrogen purge of the remaining unreacted silane gas. The tubing is again made inert by nitrogen purge and applied vacuum. After evacuation of the tubing, ethylene gas is introduced and equilibrated throughout at 25 psig, and the temperature is ramped 360° C. and held for 4 hours. Ethylene then bonds via the Si—H surface moieties to from an Si-ethyl surface. The temperature is then decreased to 40° C. and unreacted ethylene is purged out with nitrogen. The tubing is made inert by nitrogen purge and applied vacuum. If radical quenching is necessary, phenylmethylvinylsilane vapor is introduced at 16 psia followed by a thermal treatment at 360° C. for 4 hours. Unreacted phenylmethylvinylsilane is then purged out with nitrogen as the oven is cooled down to room temperature.

Example 3

It is desirable to use steel vessels to store low levels of sulfur compounds such as hydrogen sulfide and mercaptans. Steel is highly adsorptive to these compounds, and therefore is not considered an appropriate storage media for low parts per billion concentrations. The current invention provides a surface which will prevent the adsorption of low-level sulfur compounds to the steel vessel surface.

Steel vessels are packed in to a large stainless steel containment vessel which is sealed and connected to inlet and outlet tubing. The tubing is passed through the ceiling of an oven and connected to two separate manifolds through which gases and vacuum can be applied to the vessel via valve systems. With atmospheric pressure air in the vessel, the vessel temperature is increased to 120° C. and held for 1 hour. At the end of 1 hour, the vessel environment is made inert by a nitrogen purge and applied vacuum. The vessel is heated to 400° C. After evacuation of the vessel, 100% silane gas (SiH$_4$) is introduced at 2.5 psia. The temperature is held at 400° C. for 4 hours during which a hydrogenated amorphous silicon layer is deposited. The temperature is then decreased to 360° C. followed by a nitrogen purge of the remaining unreacted silane gas. The containment vessel environment is again made inert by nitrogen purge and applied vacuum. After evacuation at 360° C., ethylene gas is introduced at 25 psig and 360° C. is held for 4 hours. Ethylene then bonds via the Si—H surface moieties to form an Si-ethyl surface. Unreacted ethylene is then purged out with nitrogen and the containment vessel environment is made inert by nitrogen purge and applied vacuum. If radical quenching is necessary, phenylmethylvinylsilane vapor is introduced at 360° C. and 16 psig, and that temperature is held for 4 hours. Unreacted phenylmethylvinylsilane is then purged out with nitrogen as the oven is cooled down to room temperature.

Example 4

Borosilicate inlet liners are used in gas chromatography instruments as the area of sample introduction and transfer on to a gas chromatography column. Since raw borosilicate glass has an active surface and is adsorptive to many compounds, it is typically deactivated through a silanization process. Standard silanizations give a relatively inert surface, but can cause the chemical breakdown of unstable compounds and do not allow for universal inertness to acidic and basic compounds (e.g., carboxylic acids and amines). Some liners work well for acidic compounds and fewer types work well for basic compounds. The current invention provides a surface which will prevent the adsorption of acidic and basic compounds to the inlet liner surface.

Borosilicate inlet liners are packed into a stainless steel vessel which is sealed and connected to inlet and outlet tubing. The tubing is passed through the ceiling of an oven and connected to two separate manifolds through which gases and vacuum can be applied to the vessel via valve systems. Depending on the cleanliness of the liners, an oxidated cleaning step can be employed. With atmospheric pressure air in the vessel, the vessel temperature is increased to 120° C. and held for 1 hour. At the end of 1 hour, the vessel environment is made inert by a nitrogen purge and applied vacuum. The vessel is heated to 400° C. After evacuation of the vessel, 100% silane gas (SiH$_4$) is introduced at 2.5 psia. The temperature is held at 400° C. for 4 hours during which a hydrogenated amorphous silicon layer is deposited on the borosilicate glass. A nitrogen purge is introduced, followed by a temperature decrease to less than about 100° C. The vessel environment is again made inert by nitrogen purge and applied vacuum. After evacuation of the vessel, ethylene gas with 2.5% zero air is introduced at 8 p.s.i.g. The temperature is then increased to almost 355° C. and is held for about 4 hours. Ethylene then bonds via the Si-H surface moieties to form an Si-ethyl surface. After cooling, unreacted ethylene is then purged out with nitrogen and the vessel environment is made inert by nitrogen purge and applied vacuum. If radical quenching is necessary, phenylmethylvinylsilane vapor is introduced at 360° C. and 16 psia, and that temperature is held for 4 hours. Unreacted phenylmethylvinylsilane is then purged out with nitrogen as the oven is cooled down to room temperature.

Example 5

Uncoated fused silica capillary columns are used in gas chromatography instruments as an inert transfer line from the inlet liner to the coated fused silica capillary analytical column. Since raw fused, silica glass has an active surface and is adsorptive to many compounds, it is typically deactivated through a silanization process. Standard silanizations give a relatively inert surface, but can still cause the chemical breakdown of certain active components, and do not allow for universal inertness to acidic and base compounds (carboxylic acids and amines). Deactivated fused silica columns do not always have a desired level of inertness, and although some deactivated fused silica columns work well for acidic compounds, few types work well for basic compounds. Also, typical deactivations are not resistive to repetitive subjection to caustic environments. The current invention provides a surface on a fused silica capillary which will prevent the adsorption of acidic and basic compounds, as well as resist degradation by caustic environments.

Fused silica capillary tubing is coiled and tied in 120 m lengths, and its end are passed through the ceiling of an oven and connected to two separate manifolds through which gases and vacuum can be applied via valve systems. The inherent internal cleanliness of fused silica tubing does not require an oxidative cleaning step. The inside of the tubing is made inert by a nitrogen purge and applied vacuum. After evacuation of the tubing, 100% silane gas (SiH$_4$) is introduced at 60 psig. The temperature is ramped to about 350° C. and held for 4 hours during which a hydrogenated amorphous silicon layer is deposited on the inside of the capillary. The remaining silane gas is purged out with nitrogen followed by decreasing the oven temperature to less than about 100° C. The tubing is again made inert by nitrogen purge and applied vacuum. After evacuation of the tubing, a mixture of 2.5% air in ethylene gas is introduced and equilibrated throughout at 30 p.s.i.g., and the temperature is ramped to about 355° C. and held for about 4 hours. Ethylene then bonds via the Si—H surface moieties to form an Si-ethyl surface. The temperature is then decreased to less than about 100° C. and unreacted ethylene is purged out with nitrogen. The tubing is made inert by nitrogen purge and applied vacuum. If radical quenching is necessary, phenylmethylvinylsilane vapor is introduced at 16 p.s.i.a. followed by a thermal treatment at 360° C. for 4 hours. Unreacted phenylmethylvinylsilane is then purged out with nitrogen as the oven is cooled down to room temperature.

Example 6

It is desirable to use steel vessels to store low levels of sulfur compounds such as hydrogen sulfide and mercaptans. Steel is highly adsorptive to these compounds, and therefore is not considered an appropriate storage media for low parts per billion concentrations. The current invention provides a surface which will prevent the adsorption of low-level sulfur compounds to the steel vessel surface.

Steel vessels are packed into a large stainless steel containment vessel which is sealed and connected to inlet and outlet tubing. The tubing is passed through the ceiling of an oven and connected to two separate manifolds through which gases and vacuum can be applied to the vessel via valve systems. If an oxidative cleaning step is required, the vessel temperature is increased to 120° C. with atmospheric pressure air in the vessel and held for 1 hour. At the end of 1 hour, the vessel environment is made inert by a nitrogen purge and applied vacuum. The vessel is heated to 400° C. After evacuation of the vessel, 100% silane, gas (SiH$_4$) is introduced at 2.5 p.s.i.a. The temperature is held at 400° C. for 4 hours during which a hydrogenated amorphous silicon layer is deposited. Remaining silane gas is purged out with nitrogen followed by a reduction in temperature to less than about 100° C. The containment vessel environment is again made inert by nitrogen purge and applied vacuum. After evacuation at less than about 100° C., ethylene gas is introduced at 25 p.s.i.g. and the temperature is ramped to about 360° C. is held for 4 hours. Ethylene then bonds via the Si—H surface moieties to form an Si-ethyl surface. After cooling to less than about 100° C., unreacted ethylene is then purged out with nitrogen and the containment vessel environment is made inert by nitrogen purge and applied vacuum. If radical quenching is necessary, phenylmethylvinylsilane vapor is introduced at 360° C. and 16 psig, and that temperature is held for about 4 hours. Unreacted phenylmethylvinylsilane is then purged out with nitrogen as the oven is cooled down to room temperature.

What is claimed is:

1. Method of modifying the surface properties of a substrate, comprising the steps of:
   a) depositing a coating of hydrogenated amorphous silicon on the surface of the substrate;
   b) functionalizing the coated substrate by exposing the substrate to a binding reagent having at least one unsaturated hydrocarbon group at an effective pressure and elevated temperature for an effective length of time.

2. The method recited in claim 1, wherein said hydrogenated amorphous silicon coating is deposited by exposing the substrate to silicon hydride gas at an effective pressure and elevated temperature for an effective length of time.

3. The method recited in claim 2, including the step of isolating the substrate in an inert atmosphere before exposing the substrate to silicon hydride gas.

4. The method recited in claim 1, including the step of isolating the substrate in an inert atmosphere before functionalizing the coated substrate.

5. The method recited in claim 1, including the step of quenching residual silicon radicals in the hydrogenated amorphous silicon coating either before or after functionalizing the coated substrate.

6. The method recited in claim 5, including the step of isolating the substrate in an inert atmosphere before quenching the residual silicon radicals in the silicon coating.

7. The method recited in claim 6, said quenching step comprising exposing the substrate to organosilanes, amines, or known radical scavengers under elevated temperature for an effective length of time to cause thermal disproportionation.

8. The method recited in claim 7, including quenching the substrate at a temperature between about 250° and 500° C. for about 30 minutes to about 24 hours.

9. The method recited in claim 1, including the step of exposing the substrate to oxygen prior to or contemporaneous with functionalizing the substrate.

10. The method recited in claim 1, including the step of controlling the pressure, temperature and time of step (a) to prevent formation of hydrogenated amorphous silicon dust.

11. The method recited in claim 1, including cleaning the substrate by heating it at a temperature between about 100° and about 600° C. for a time period ranging from a few minutes to about 15 hours before step (a).

12. The method recited in claim 11, including cleaning the substrate at about 120° C. for about 1 hour.

13. The method recited in claim 1, wherein said silicon coating is deposited by exposing the substrate to silicon hydride gas at a pressure between about 0.01 p.s.i.a. to about 215 p.s.i.a. and a temperature between about 200° and 600° C. for about 10 minutes to about 24 hours.

14. The method recited in claim 1, wherein said silicon coating is deposited by exposing the substrate to silicon hydride gas at a pressure between about 1.0 p.s.i.a. and about 100 p.s.i.a. and a temperature between about 300° and 600° C. for about 30 minutes to about 6 hours.

15. The method recited in claim 1, wherein said silicon coating is deposited by exposing the substrate to silicon hydride gas at a temperature between about 350° and about 400° C. for about 4 hours at a pressure between about 2.3 p.s.i.a. and about 95 p.s.i.a.

16. The method recited in claim 1, wherein said silicon coating is deposited by exposing the substrate to silicon hydride gas at a temperature of about 400° C. and pressure of about 2.5 p.s.i.a.

17. The method recited in claim 1, wherein said silicon coating is deposited by exposing the substrate to silicon hydride gas at a temperature of about 400° C. and a pressure of about 54 p.s.i.a., and then increasing the temperature to about 355° C.

18. The method recited in claim 1, including hydrosilylating the substrate at a pressure between about 0.01 p.s.i.a. to about 200 p.s.i.a. and a temperature between about 200° and 500° C. for about 30 minutes to about 24 hours.

19. The method recited in claim 18, including initially exposing the substrate to the binding reagent at a temperature less than about 100° C., and then increasing the temperature between 250° and 500° C. and maintaining the pressure less than about 100 p.s.i.a.

20. The method recited in claim 9, including mixing up to about 5% by weight oxygen with said binding reagent.

21. The method recited in claim 9, including exposing the substrate to 100% oxygen or mixtures of oxygen in other gases at a temperature of about 100° to 450° C. for a few seconds to about 1 hour prior to hydrosilylating.

22. The method recited in claim 21, including exposing the substrate to zero air at about 40 p.s.i.a. and about 325° C. for about 1 minute.

23. Method of modifying the surface properties of a substrate, comprising the steps of:
   a) depositing a coating of hydrogenated amorphous silicon on the surface of the substrate;
   b) functionalizing the coated substrate by exposing the substrate to a binding reagent having at least one unsaturated hydrocarbon group under a effective pressure and elevated temperature for a effective length of time
   wherein said hydrogenated amorphous silicon coating is deposited by exposing the substrate to silicon hydride gas under a effective pressure and elevated temperature for a effective length of time;
   including the step of isolating the substrate in an inert atmosphere before exposing the substrate to silicon hydride gas;
   including the step of isolating the substrate in an inert atmosphere before functionalizing the coated substrate;
   including the step of quenching residual silicon radicals in the hydrogenated amorphous silicon coating either before or after functionalizing the coated surface;
   including the step of isolating the substrate in an inert atmosphere before quenching the residual silicon radicals in the silicon coating;
   said quenching step comprising exposing the substrate to organosilanes, amines, or known radical scavengers under elevated pressure and temperature for a effective length of time to cause thermal disproportionation;
   including quenching the substrate at a temperature between about 250° and 500° C. for about 30 minutes to about 24 hours;

including the step of exposing the substrate to oxygen prior to or contemporaneous with the functionalizing the substrate;

including the step of controlling the pressure, temperature and time of step (a) to prevent formation of hydrogenated amorphous silicon dust;

including cleaning the substrate by heating it at a temperature between about 100° and about 600° C. for a time period ranging from a few minutes to about 15 hours before step (a);

including exposing the substrate to silicon hydride gas at a pressure between about 0.01 p.s.i.a. to about 215 p.s.i.a. and a temperature between about 200° and 600° C. for about 10 minutes to about 24 hours;

including functionalizing the substrate at a pressure between about 0.01 p.s.i.a. to about 215 p.s.i.a. and a temperature between about 200° and 500° C. for about 30 minutes to about 24 hours;

including mixing up to about 5% by weight oxygen with said binding reagent;

including exposing the substrate to 100% oxygen or mixtures of oxygen in other gases at a temperature of about 100° to 450° C. for a few seconds to about 1 hour prior to functionalization; and, including exposing the substrate to zero air at about 40 p.s.i.a. and about 325° C. for about 1 minute.

24. A substrate having modified surface properties, said substrate having a first layer of hydrogenated amorphous silicon, and a second layer of organic groups covalently bonded by the hydrosilylation of an unsaturated moiety within said organic group.

25. The substrate recited in claim 24, said first layer having been formed by depositing a coating of hydrogenated amorphous silicon on the surface of the substrate, and said second layer having been formed by functionalizing the coated substrate by exposing the substrate to a binding reagent having at least one unsaturated hydrocarbon group at a predetermined pressure and elevated temperature for a effective length of time.

26. The substrate recited in claim 24, said hydrogenated amorphous silicon coating having been deposited by exposing the substrate to silicon hydride gas at a effective pressure and elevated temperature for a predetermined length of time.

* * * * *